United States Patent [19]

Stahlhofen

[11] Patent Number: 5,143,815

[45] Date of Patent: Sep. 1, 1992

[54] LIGHT-SENSITIVE MIXTURE BASED ON 1,2-NAPHTHOQUINONE-DIAZIDES, AND REPRODUCTION MATERIAL PRODUCED WITH THIS MIXTURE

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 235,628

[22] Filed: Aug. 24, 1988

[30] Foreign Application Priority Data

Aug. 31, 1987 [DE] Fed. Rep. of Germany ....... 3729034

[51] Int. Cl.⁵ .................. G03F 7/022; G03F 7/023; G03C 1/54
[52] U.S. Cl. .................. 430/192; 430/165; 430/193; 534/566; 534/567
[58] Field of Search ............ 430/193, 192; 534/567, 534/566

[56] References Cited

U.S. PATENT DOCUMENTS

| | | | |
|---|---|---|---|
| 3,046,118 | 7/1962 | Schmidt | 430/193 |
| 3,687,663 | 8/1972 | Bloom | 430/193 |
| 3,802,885 | 4/1974 | Lawson et al. | 96/75 |
| 4,153,461 | 5/1979 | Berghäuser et al. | 96/75 |
| 4,407,926 | 10/1983 | Stahlhofen | 430/165 |
| 4,424,270 | 1/1984 | Erdmann et al. | 430/166 |
| 4,588,670 | 5/1986 | Kelly et al. | 430/165 |
| 4,628,020 | 12/1986 | Stahlhofen | 430/165 |
| 4,659,642 | 4/1987 | Platzer et al. | 430/143 |

FOREIGN PATENT DOCUMENTS 739654 11/1955 United Kingdom .
935250 8/1963 United Kingdom .

*Primary Examiner*—Charles L. Bowers, Jr.
*Attorney, Agent, or Firm*—Foley & Lardner

[57] ABSTRACT

A light-sensitive mixture is disclosed which contains a 1,2-naphthoquinone-2-diazide-sulfonic acid ester and a binder. A reproduction material produced with this mixture is also disclosed. The naphthoquinone-diazide-sulfonic acid ester is a compound of the general formula I

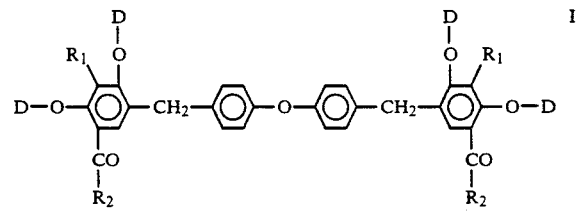

in which D is a 1,2-naphthoquinone-2-diazide-4-sulfonyl or 1,2-naphthoquinone-2-diazide-5-sulfonyl radical, $R_1$ is hydrogen or an -OD group, and $R_2$ is alkyl or substituted or unsubstituted aryl, preferably alkyl having 1 to 10 carbon atoms or substituted or unsubstituted phenyl.

The light-sensitive mixture is highly photosensitive, has good overdevelopment resistance and is resistant to fountain solutions and petroleum hydrocarbons.

10 Claims, No Drawings

LIGHT-SENSITIVE MIXTURE BASED ON 1,2-NAPHTHOQUINONE-DIAZIDES, AND REPRODUCTION MATERIAL PRODUCED WITH THIS MIXTURE

BACKGROUND OF THE INVENTION

The present invention relates to a light-sensitive mixture comprising a 1,2-naphthoquinone-2-diazide-sulfonic acid ester and a resinous binder which is insoluble in water and soluble or at least swellable in aqueous-alkaline solutions. The invention also relates to a reproduction material produced with this mixture.

Light-sensitive compounds based on 1,2-naphthoquinone-diazides are known from DE-C 938,233 corresponding to GB-B 739,654; U.S. Pat. No. 3,802,885; DE-A 3,100,077 corresponding to U.S. Pat. No. 4,424,270; and EP-A 0,052,788 corresponding to U.S. Pat. No. 4,407,926. These compounds are di- or trihydroxybenzophenones which are partially or completely esterified with 1,2-naphthoquinone-diazide-sulfonic acids. The compounds are mainly used as completely esterified representatives, i.e., they no longer contain any free phenolic hydroxyl groups. Compounds of this type have, however, the disadvantage of a light sensitivity which is too low for some purposes, or the disadvantage of inadequate solubility in the organic solvents normally used for coating supports such as printing plates. Moreover, in combination with binders such as novolaks, they give layers which, in the unexposed state, are not sufficiently resistant to the commonly used alkaline developer solutions. The layers are attacked to a certain extent during printing in offset printing presses when alcohol-containing fountain solutions are used and also by petroleum hydrocarbons such as are frequently used during printing for washing off the oleophilic printing ink from the plate.

DE-C 1,118,606, corresponding to GB-C 935,250, discloses 1,2-naphthoquinone-diazide-sulfonic acid esters of phenolic compounds such as derivatives of diphenylmethane. For reasons of adhesion, these esters contain at least one free hydroxyl group.

SUMMARY OF THE INVENTION

It is an object of the invention to provide a light-sensitive, positive-working mixture that contains a 1,2-naphthoquinone-2-diazide-sulfonic acid ester as the light-sensitive compound and that, in its printing and reproduction technology properties is comparable with the best hitherto known mixtures of this type, but that has a higher chemical resistance and a better resistance to aqueous-alkaline developer solutions and to the organic solvents used in offset printing.

It is also an object of the invention to provide an improved reproduction material made with the light-sensitive mixture according to the invention.

In accomplishing these objects there is provided according to one aspect of the invention a light-sensitive mixture comprising a resinous binder that is insoluble in water and soluble or at least swellable in aqueous-alkaline solutions, and a naphthoquinone-diazide-sulfonic acid ester of the formula I

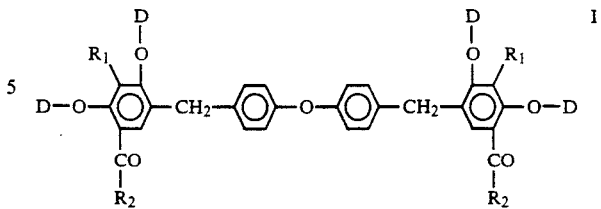

in which D is a 1,2-naphthoquinone-2-diazide-4-sulfonyl or 1,2-naphthoquinone-2-diazide-5-sulfonyl radical, $R_1$ is hydrogen or an -OD group, and $R_2$ is alkyl or substituted or unsubstituted aryl.

In accordance with another aspect of the invention, there has been provided a light-sensitive reproduction material comprising a support and a light-sensitive layer on said support, wherein the light-sensitive layer contains the above-described mixture.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Light-sensitive mixtures according to the present invention comprise a 1,2-naphthoquinone-2-diazide-4- or -5-sulfonic acid ester as the light-sensitive compound and a resinous binder which is insoluble in water and soluble or at least swellable in aqueous-alkaline solutions. The mixture comprises a naphthoquinone-diazide-sulfonic acid ester of the general formula I

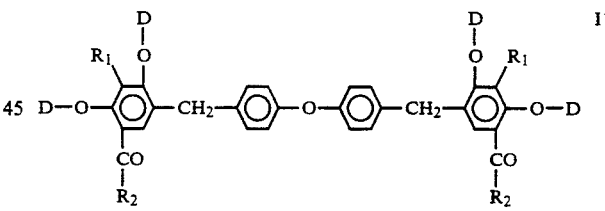

in which
D is a 1,2-naphthoquinone-2-diazide-4-sulfonyl or 1,2-naphthoquinone-2-diazide-5-sulfonyl radical,
$R_1$ is hydrogen or an -OD group, and
$R_2$ is alkyl or substituted or unsubstituted aryl.

Particularly preferably, the mixture contains an ester of the general formula I, in which $R_2$ is alkyl having 1 to 10 carbon atoms or substituted or unsubstituted phenyl.

The alkyl radical $R_2$ can be straight-chain or branched The aryl radical $R_2$ is preferably mononuclear and can be substituted by lower alkyl or lower alkoxy groups or halogen atoms. Compounds in which $R_2$ is an aryl radical, especially a phenyl radical, are preferred. Accordingly, a 1,2-naphthoquinone-2-diazide-sulfonic acid ester is preferably used which is the esterification product obtained from 1 mol of 4,4'-bis-(5-benzoyl-2,3,4-trihydroxybenzyl)-diphenyl ether and 6 mol of 1,2-naphthoquinone-2-diazide-sulfonic acid chloride.

The 1,2-naphthoquinone-diazides contained in the mixture according to the invention are prepared, analogously to known processes, by esterifying the phenolic hydroxyl groups of the parent compounds with 1,2-naphthoquinone-diazide-sulfonic acids or reactive derivatives thereof, for example, the sulfonic acid chlorides.

The corresponding parent compounds, for example, the 4,4'-bis- (2,3,4-trihydroxy-5-acylbenzyl)-diphenyl ethers, are obtained in good yield by reacting the corresponding 4-acylpyrogallols with 4,4'-bis-(methoxymethyl)-diphenyl ether in an inert solvent, for example, diglycol dimethyl ether, at 130°–140° C. in the presence of methanesulfonic acid as a condensing agent.

The mixtures according to the invention are distinguished by high light sensitivity and good developer resistance. They also show high resistance to alcohol-containing fountain solutions and to petroleum hydrocarbons.

Due to its relatively large molecule, the compound according to the invention has a low diffusivity. It can therefore be used with advantage for copying layers employed for certain color proofing methods in multicolor printing such as, e.g., in color testing by the so-called surprint method. In this case, a multi-color image is produced by transferring positive color separation images to a common receiving sheet or producing them on the latter, without a separate application of interlayers being necessary.

The concentration of the 1,2-naphthoquinone-diazide-sulfonic acid esters according to the invention in the light-sensitive mixture can vary within relatively wide limits. Preferably, the proportion is about 3 to 50 and especially about 7 to 25 percent by weight, relative to the content of non-volatile constituents of the light-sensitive mixture.

If desired, the 1,2-naphthoquinone-diazide-sulfonic acid esters can also be used as a mixture with other quinone-diazides or with mixtures of compounds having at least one C-O-C bond, which can be cleaved by acid, together with a compound which forms a strong acid on exposure to light.

The light-sensitive mixtures according to the invention also contain a polymeric, water-insoluble resinous binder which dissolves in the solvents used for the mixture according to the invention and is also soluble or at least swellable in aqueous alkalies.

The novolak condensation resins, proven in many positive reproduction materials based on 1,2-quinone-diazides, have here again proved to be a suitable binder. The novolaks can be additionally modified in a known manner by reaction of a part of their hydroxyl groups with, for example, chloroacetic acid, isocyanates, epoxides or carboxylic acid anhydrides. Polyhydroxyphenyl resins, which are prepared by condensation from phenols and aldehydes or ketones, copolymers of styrene and maleic anhydride, polyvinylphenols or polymers or copolymers of acrylic acid or methacrylic acid are used as further binders which are soluble in alkali or swellable in alkali. Polymers or copolymers of acrylic and/or methacrylic acid, which have been esterified with a phenol, in particular, a polyhydric phenol, are preferred. The nature and quantity of the binder can vary depending on the intended use. Proportions between about 90 and 39 and especially between about 85 and 55 percent by weight in total solids are preferred.

Moreover, numerous other resins can also be used in addition, preferably epoxy resins and vinyl polymers such as polyvinyl acetate, polyacrylates, polyvinyl acetals, polyvinyl ethers, polyvinylpyrrolidones and the copolymers of their basic monomers as well as hydrogenated or partially hydrogenated colophony derivatives. The most advantageous proportion of these resins depends on the application requirements and on the effect on the development conditions, and it is in general not more than about 50 percent by weight, preferably about 2 to 35 percent by weight, of the binder employed. For special requirements, such as flexibility, adhesion, gloss and coloration, the light-sensitive mixture can in addition also contain small quantities of substances such as polyglycols, cellulose derivatives such as ethylcellulose, wetting agents, dyes, adhesion promoters and finely disperse pigments and, if required, UV absorbers.

Moreover, for the color change after exposure, small quantities of radiation-sensitive components, which form or release preferably strong acids on exposure and cause a color change in a secondary reaction with a suitable dye, can also be added to the light-sensitive mixture. Examples of such radiation-sensitive components are 1,2-naphthoquinone-diazide-4-sulfonic acid chloride, halogenomethyl-s-triazines substituted by a chromophore or diazonium compounds in the form of their salts with complex acids such as fluoboric acid or hexafluorophosphoric acid.

The invention also provides a light-sensitive reproduction material composed of a support and a light-sensitive layer which contains the mixture according to the invention.

For coating a suitable support, the mixture is in general dissolved in a solvent or solvent mixture. The choice of solvent should be matched to the intended coating process, to the layer thickness and to the drying conditions. Suitable solvents are ketones such as methyl ethyl ketone, chlorinated hydrocarbons such as trichloroethylene and 1,1,1-trichloroethane, alcohols such as n-propanol, ethers such as tetrahydrofuran, alcohol ethers such as ethylene glycol monoalkyl ethers, and esters such as butyl acetate. For special purposes, solvent mixtures can in addition also contain further solvents such as acetonitrile, dioxane or dimethylformamide. In principle, all solvents can be used which do not irreversibly react with the layer components. Partial ethers of glycols, in particular, ethylene glycol monomethyl ether and propylene glycol methyl ether, or the corresponding monoacetates are particularly preferred.

The supports used for layer thicknesses of less than about 10 μm are in most cases metals. For offset printing plates, it is possible to use: mill-finished, mechanically or electrochemically roughened and, if appropriate, anodized aluminum which can additionally also have been chemically pretreated, for example, with polyvinylphosphonic acid, silicates, phosphates, hexafluorozirconates or with hydrolyzed tetraethyl orthosilicate.

The coating of the support is carried out in known, conventional manner by whirler-coating, spray-coating, dipping, by roller or die coating, by means of doctor blades or by curtain coating. Exposure is carried out with the light sources conventional in technology.

For developing, aqueous-alkaline solutions of graded alkalinity are used, which preferably have a pH in the range of about 10–14 and can also contain small quantities of organic solvents or wetting agents.

For producing a printing form, the light-sensitive material is imagewise exposed under a positive original and then developed by means of an aqueous-alkaline developer. For the imagewise exposure, the usual types of apparatus, such as tubular lamps, pulsed xenon lamps, metal halide-doped mercury vapor lamps or carbon arc lamps can be used.

The light-sensitive mixtures are preferably used in the production of reproduction materials such as printing forms, i.e., especially forms for offset printing, autotype gravure printing and screen printing, or in liquid or dry resists.

The printing plates produced with the use of the 1,2-naphthoquinone-diazides according to the invention have a high light sensitivity in practice and an improved resistance to alkaline developers and those organic solvents which are normally used during copying work or during the printing process on the printing presses. The 1,2-naphthoquinone-diazides themselves are distinguished by good solubility in the usual solvents, by a pronounced oleophilic character and by good compatibility with the other constituents of the copying layer.

The invention is explained in more detail by reference of the examples which follow, wherein parts by weight (p.b.w.) and parts by volume (p.b.v.) are in the same relationship as the g and $cm^3$. Unless otherwise stated, percentages are percent by weight.

EXAMPLE 1

An electrochemically roughened and anodized aluminum plate having an oxide weight of 3 g/m² was coated with a solution of:
1.60 p.b.w. of the esterification product obtained from 1 mol of 4,4'-bis-(5-benzoyl-2,3,4-trihydroxybenzyl)-diphenyl ether and 6 mol of 1,2-naphthoquinone-2-diazide-5-sulfonic acid chloride,
7.00 p.b.w. of a cresol/formaldehyde novolak having a melting range of 127°–145° C.,
0.006 p.b.w. of 2,4-bis-(trichloromethyl)-6-p-stilbenyl-s-triazine, and
0.07 p.b.w. of crystal violet in
40 p.b.v. of ethylene glycol monomethyl ether, and
60 p.b.v. of tetrahydrofuran.

Before the application of the light-sensitive layer, the anodized aluminum support had been treated with an aqueous solution of polyvinylphosphonic acid, as is described in DE-C 1,621,478 corresponding to U.S. Pat. No. 4,153,461.

The light-sensitive material thus obtained, having a weight of the light-sensitive layer of about 2.3 g/m², was exposed imagewise under a transparent positive original and then developed with a 4% aqueous solution of sodium metasilicate.

The areas of the copying layer struck by light were removed by the development, and the unexposed image areas remained on the support, so that a printing stencil corresponding to the original was obtained. The printing form thus produced gave about 150,000 perfect prints in an offset printing press. The printing stencil was distinguished by outstanding overdevelopment resistance and adhesion to the substrate.

In order to extend the print run and to consolidate the printing stencil, the printing form thus produced can also be subjected to a heat treatment. For this purpose, the printing form, dried after development, was heated in a baking oven for 5 minutes to 230° C.

The heating of the printing form resulted in a consolidation of the printing stencil, and the layer became resistant to chemicals and hence insoluble in organic solvents such as acetone, alcohols, dimethylformamide, toluene or xylene. About 400,000 perfect prints were obtained in an offset printing press.

The 1,2-naphthoquinone-diazide can also be used with advantage as a photosensitizer in layers such as are used in practice for color proofing methods for checking color separation films. Typical compositions of appropriate light-sensitive coating solutions are indicated, for example, in EP-A 0,179,274 corresponding to U.S. Pat. No. 4,659,642.

In the examples which follow, further coating solutions are indicated, in which results similar to those in this example were obtained. Unless otherwise stated, the support, preparation and processing of the printing plates obtained with these solutions correspond to the data given above.

EXAMPLE 2

Coating solution:
1.60 p.b.w. of the esterification product obtained from 1 mol of 4,4'-bis-(5-octanoyl-2,3,4-trihydroxy-benzyl)-diphenyl ether and 6 mol of 1,2-naphthoquinone-2-diazide-5-sulfonic acid chloride,
7.00 p.b.w. of a cresol/formaldehyde novolak having a melting range of 127°–145° C.,
0.06 p.b.w. of 2,4-bis-(trichloromethyl)-6-p-stilbenyl-s-triazine, and
0.07 p.b.w. of crystal violet in
40 p.b.v. of ethylene glycol monomethyl ether, and
60 p.b.v. of tetrahydrofuran.

EXAMPLE 3

1.80 p.b.w. of the esterification product obtained from 1 mol of 4,4'-bis-(5-benzoyl-2,3,4-trihydroxy-benzyl)-diphenyl ether and 6 mol of 1,2-naphthoquinone-2-diazide-4-sulfonic acid chloride,
7.00 p.b.w. of a cresol/formaldehyde novolak having a melting range of 127°–145° C.,
0.06 p.b.w. of 2,4-bis-(trichloromethyl)-6-p-stilbenyl-s-triazine, and
0.07 p.b.w. of crystal violet in
40 p.b.v. of ethylene glycol monomethyl ether, and
60 p.b.v. of tetrahydrofuran.

EXAMPLE 4

1.80 p.b.w. of the esterification product obtained from 1 mol of 4,4'-bis-(5-acetyl-2,3,4-trihydroxybenzyl)-diphenyl ether and 6 mol of 1,2-naphthoquinone-2-diazide-5-sulfonic acid chloride,
7.20 p.b.w. of a cresol/formaldehyde novolak having a melting range of 127°–145° C.,
0.06 p.b.w. of 2,4-bis(trichloromethyl)-6-p-stilbenyl-s-triazine,
0.07 p.b.w. of crystal violet in
40 p.b.v. of ethylene glycol monomethyl ether, and
60 p.b.v. of tetrahydrofuran.

EXAMPLE 5

1.60 p.b.w. of the esterification product obtained from 1 mol of 4,4'-bis-(5-benzoyl-2,4-dihydroxybenzyl)-diphenyl ether and 4 mol of 1,2-naphthoquinone-2-diazide-5-sulfonic acid chloride,
6.80 p.b.w. of a cresol/formaldehyde novolak having a melting range of 127°–145° C.,
0.06 p.b.w. of 2,4-bis(trichloromethyl)-6-p-stilbenyl-s-triazine,
0.07 p.b.w. of crystal violet in
40 p.b.v. of ethylene glycol monomethyl ether, and
60 p.b.v. of tetrahydrofuran.

What is claimed is:

1. A positive-working light-sensitive mixture comprising, in admixture:

a resinous binder that is insoluble in water and soluble or at least swellable in aqueous-alkaline solutions, present in an amount sufficient to produce a uniform layer when the mixture is coated on a support; and a photosensitive naphthoquinone-diazide-sulfonic acid ester of the formula I

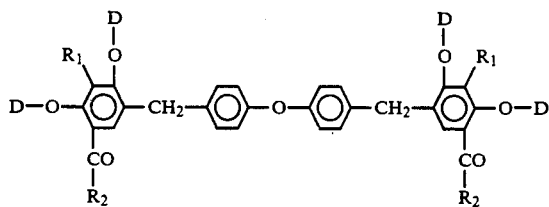

in which

D is a 1,2-naphthoquinone-2-diazide-4-sulfonyl or 1,2-naphthoquinone-2-diazide-5-sulfonyl radical, $R_1$ is hydrogen or an -OD group, and $R_2$ is alkyl substituted or unsubstituted aryl, the compound of formula I being present in an amount sufficient to render exposed areas of a coating of the mixture soluble in aqueous-alkaline developer.

2. A mixture as claimed in claim 1, wherein, in the formula I, $R_2$ is alkyl having 1 to 10 carbon atoms or substituted or unsubstituted phenyl.

3. A mixture as claimed in claim 1, wherein the 1,2-naphthoquinone-2-diazide-sulfonic acid ester is the esterification product obtained from 1 mol of 4,4'bis-(5-benzoyl-2,3,4-trihydroxybenzyl)-diphenyl ether and 6 mol of 1,2-naphthoquinone-2-diazide-5-sulfonic acid chloride.

4. A mixture as claimed in claim 1, which, relative to its content of non-volatile constituents, contains about 3 to 50 percent by weight of the naphthoquinone-diazide sulfonic acid ester compounds of the formula I.

5. A mixture as claimed in claim 1, wherein the binder comprises a novolak condensation resin.

6. A mixture as claimed in claim 1, wherein the binder comprises at least one of a polymer or copolymer of acrylic or methacrylic acid esterified with a polyhydric phenol.

7. A mixture as claimed in claim 1, in which $R_2$ is phenyl.

8. A mixture as claimed in claim 1, consisting essentially of the recited components.

9. A light-sensitive reproduction material, comprising a support and a light-sensitive layer containing a mixture as claimed in claim 1 on said support.

10. A mixture as claimed in claim 1, which, relative to its content of non-volatile constituents, contains about 7 to 25 percent by weight of the naphthoquinone-diazide sulfonic acid ester compounds of the formula I.

* * * * *